United States Patent
Umehara et al.

(10) Patent No.: US 12,082,504 B2
(45) Date of Patent: Sep. 3, 2024

(54) COMPOSITE SUBSTRATE, PIEZOELECTRIC DEVICE, AND METHOD FOR MANUFACTURING COMPOSITE SUBSTRATE

(71) Applicant: KYOCERA Corporation, Kyoto (JP)

(72) Inventors: Motohiro Umehara, Yasu (JP); Kuniaki Mitsuda, Omihachiman (JP)

(73) Assignee: Kyocera Corporation, Kyoto (JP)

( * ) Notice: Subject to any disclaimer, the term of this patent is extended or adjusted under 35 U.S.C. 154(b) by 724 days.

(21) Appl. No.: 17/272,490

(22) PCT Filed: Sep. 6, 2019

(86) PCT No.: PCT/JP2019/035146
§ 371 (c)(1),
(2) Date: Mar. 1, 2021

(87) PCT Pub. No.: WO2020/050396
PCT Pub. Date: Mar. 12, 2020

(65) Prior Publication Data
US 2021/0320243 A1  Oct. 14, 2021

(30) Foreign Application Priority Data

Sep. 6, 2018  (JP) .................................. 2018-167072

(51) Int. Cl.
*H10N 30/072* (2023.01)
*H03H 9/02* (2006.01)
*H10N 30/00* (2023.01)

(52) U.S. Cl.
CPC ...... *H10N 30/072* (2023.02); *H03H 9/02574* (2013.01); *H10N 30/706* (2024.05)

(58) Field of Classification Search
CPC ........... H10N 30/072; H10N 30/10513; H03H 9/02574; H03H 9/02866
See application file for complete search history.

(56) References Cited

U.S. PATENT DOCUMENTS

2005/0255234 A1* 11/2005 Kanda .................... H03H 9/175
29/25.35
2006/0160345 A1* 7/2006 Liu ..................... H01L 21/0242
257/E21.112
(Continued)

FOREIGN PATENT DOCUMENTS

JP  H8-83802 A  3/1996
JP  2004235794 A  *  8/2004  ............... H03H 3/08
(Continued)

OTHER PUBLICATIONS

Machine translation of JP-2004235794-A, Aug. 19, 2004 (Year: 2004).*

*Primary Examiner* — Emily P Pham

(74) *Attorney, Agent, or Firm* — Procopio, Cory, Hargreaves & Savitch LLP

(57) ABSTRACT

A composite substrate of the present disclosure is a composite substrate in which a piezoelectric substrate and a sapphire substrate are directly bonded, and a bonding surface of the sapphire substrate has a step bunch structure. A piezoelectric device of the present disclosure includes the composite substrate. A method for manufacturing a composite substrate includes the steps of: preparing a piezoelectric substrate and a sapphire substrate including a surface having a predetermined off-angle to a specific crystal plane, heat treating the sapphire substrate in an oxidizing atmosphere to form a step bunch on the surface of the sapphire substrate, and bonding the piezoelectric substrate and the surface of the sapphire substrate directly.

11 Claims, 2 Drawing Sheets

(56) References Cited

U.S. PATENT DOCUMENTS

2016/0247885 A1\* 8/2016 Shatalov ................. H01L 33/12
2019/0288661 A1   9/2019 Akiyama et al.

FOREIGN PATENT DOCUMENTS

| JP | 2005-47718 A | 2/2005 | |
|---|---|---|---|
| JP | 2014-147054 A | 8/2014 | |
| JP | 2018-61226 A | 4/2018 | |
| WO | WO-2020187986 A1 \* | 9/2020 | ....... H01L 21/02381 |

\* cited by examiner

COMPOSITE SUBSTRATE, PIEZOELECTRIC DEVICE, AND METHOD FOR MANUFACTURING COMPOSITE SUBSTRATE

TECHNICAL FIELD

The present disclosure relates to a composite substrate having a structure in which a piezoelectric substrate and a support substrate are bonded, a piezoelectric device having the composite substrate, and a method for manufacturing the composite substrate.

BACKGROUND ART

In recent years, there has been a demand for miniaturization and higher performance of piezoelectric devices such as surface acoustic wave devices used in communication devices such as mobile phones. As a small and high performance piezoelectric device, it is suggested that a piezoelectric device has a structure in which an element electrode is formed on a piezoelectric substrate of a composite substrate where the piezoelectric substrate and a support substrate are bonded. A variety of materials are used as the support substrate. Among them, sapphire has superior mechanical strength, insulation, and heat dissipation, making it particularly suitable as the support substrate.

In the composite substrate, spurious caused by the reflection of bulk waves at the bonding interface between the piezoelectric substrate and the support substrate is a problem. To solve this problem, Patent Document 1 discloses a laminated piezoelectric substrate in which the surface of a support layer is roughened by a lapping process. In Patent Document 2, it is described that a silicon substrate forming a pyramid-shaped concavo-convex structure by wet etching is used as a support substrate.

However, in a mechanical roughening treatment such as the lapping process, a processing altered layer containing residual stress and crystal defects is formed by the process. The processing altered layer tends to be the cause of a decrease in the bonding strength. In anisotropic etching of silicon, the rate difference due to differences in crystal orientations is large, and the pyramid-shaped concavo-convex which is uniformed and well-formed appears. However, anisotropic etching of sapphire is difficult to control the shape due to the small rate difference between crystal orientations. Regarding the anisotropic etching of sapphire, for example, a pit formation by thermal phosphoric acid is described in Patent Document 3. However, this is an etch pit formation originating from crystal defects, and it is not easy to make a uniform and well-formed concavo-convex. Further, the anisotropic etching has a problem that it only makes a concavo-convex of a specific crystal orientation.

On the other hand, when a single crystal substrate having a main surface provided with a predetermined off-angle (inclination angle) to a specific crystal plane is heat-treated under appropriate conditions, a substantially equally spaced stepped structure (step bunch) having a specific facet plane to the crystal plane and the off-angle is formed on its surface. For example, Patent Document 4 describes that a step bunch is formed by heat-treating a sapphire substrate, which is inclined at a predetermined angle from a c-plane, a-plane, m-plane or r-plane, under an air atmosphere.

PRIOR ART DOCUMENTS

Patent Documents

Patent Document 1: Japanese Unexamined Patent Publication No. 2014-147054
Patent Document 2: Japanese Unexamined Patent Publication No. 2018-61226
Patent Document 3: Japanese Unexamined Patent Publication No. 2005-47718
Patent Document 4: Japanese Unexamined Patent Publication No. 2004-235794

SUMMARY OF THE INVENTION

Problem to be Solved by the Invention

The present disclosure aims to provide a composite substrate and a piezoelectric device in which the bonding strength between a piezoelectric substrate and a support substrate is high and the reflection of bulk waves at the bonding surface is reduced.

Means for Solving the Problem

The composite substrate of the present disclosure is a composite substrate in which a piezoelectric substrate and a sapphire substrate are directly bonded, and has a step bunch structure on the bonding surface of the sapphire substrate. The piezoelectric device of the present disclosure has the composite substrate. The method for manufacturing the composite substrate of the present disclosure includes the steps of: preparing the piezoelectric substrate and the sapphire substrate including a surface having a predetermined off-angle to a specific crystal plane, heat treating the sapphire substrate in an oxidizing atmosphere to form a step bunch on the surface of the sapphire substrate, and bonding the piezoelectric substrate and the surface of the sapphire substrate directly.

Effects of the Invention

According to the present disclosure, it is possible to provide a composite substrate and a piezoelectric device in which the bonding strength between a piezoelectric substrate and a support substrate is high, and the reflection of bulk waves at the bonding surface is reduced.

EMBODIMENTS FOR CARRYING OUT THE INVENTION

The composite substrate and piezoelectric device of the present disclosure are explained with reference to the figures.

<Composite Substrate and Piezoelectric Device>

Figure 1A:
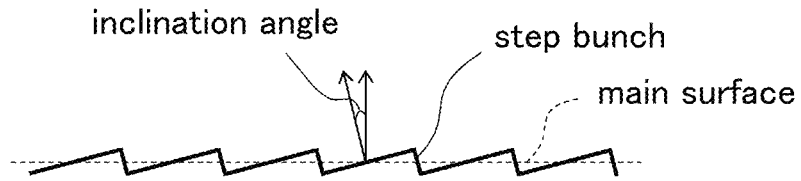
FIG. 1A is a substantially equally spaced stepped structure (step bunch) of a main surface of a single crystal substrate of the prior art.
Figure 1B:
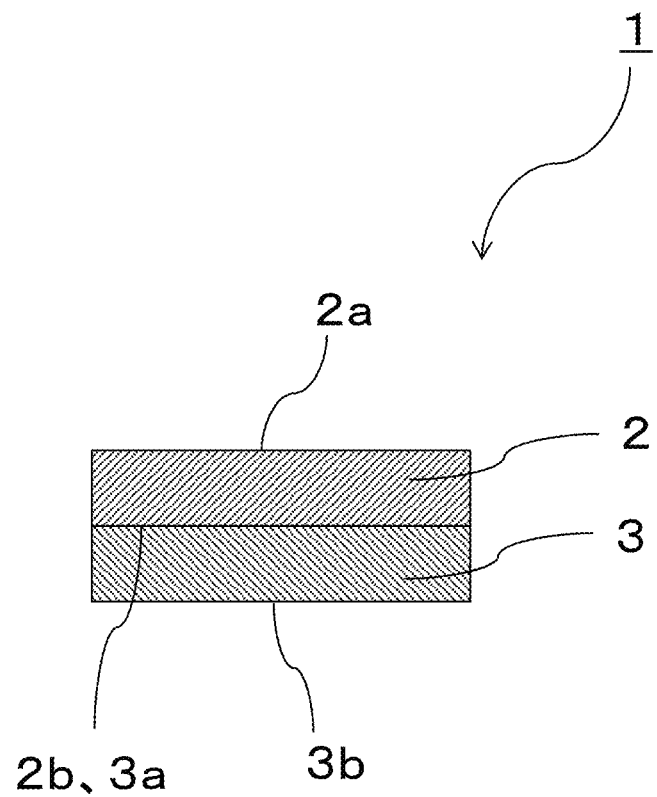
FIG. 1B is a schematic sectional view showing the composite substrate according to one embodiment of the present disclosure.

FIG. 1 shows schematic sectional view of a composite substrate 1 according to one embodiment of the present disclosure. The composite substrate 1 is a composite substrate in which a piezoelectric substrate 2 and a sapphire substrate 3 are directly bonded, and has a step bunch structure on a bonding surface 3a of the sapphire substrate 3 that is bonded to the piezoelectric substrate 2. The piezoelectric device according to one embodiment of the present disclosure has the composite substrate 1. The piezoelectric device includes an oscillator used in an oscillation circuit or the like and an acoustic wave device such as a surface acoustic wave device, a boundary acoustic wave device, a bulk wave device or the like, used in a filter circuit or the like.

Hereinafter, the composite substrate 1 according to one embodiment is explained in detail. The composite substrate 1 has the piezoelectric substrate 2 having a first surface 2a and a second surface 2b opposing each other, and the sapphire substrate 3 having a third surface 3a and a fourth surface 3b opposing each other. Then, the second surface 2b and the third surface 3a are opposed to each other and directly bonded. An element electrode is formed on the first surface 2a of the piezoelectric substrate 2 and is used as the composite substrate 1 for a piezoelectric device such as a surface acoustic wave device. For convenience, the following explanation is based on an example in which the piezoelectric substrate 2 is a substrate for a surface acoustic wave device. The piezoelectric substrate 2 is not limited to this but may be a substrate for other applications or functions such as a substrate for a sensor of a vibration sensor or the like or a substrate for an oscillator.

The direct bonding means that the piezoelectric substrate 2 and the sapphire substrate 3 are bonded in direct contact with each other without adhesives or the like. Specific bonding forms include diffusion bonding or the like.

In the composite substrate 1, the first surface 2a is an element forming surface for the element electrode or the like, the second surface 2b and the third surface 3a are bonding surfaces, and the fourth surface 3b is a back surface. The element forming surface is a part where a functional part such as the element electrode is located, as described above. The element electrode is, for example, interdigital electrodes that are positioned so as to engage with each other. By the surface acoustic wave between the interdigital electrodes, filtering or the like of signals transmitted between the interdigital electrodes is performed.

Conventionally, a surface acoustic wave device including a composite substrate has a problem that noise called spurious is generated at frequency higher than a passband (a frequency band through which a band-pass filter passes signals without attenuation). The noise is caused by the reflection of bulk waves at the bonding interface between the piezoelectric substrate 2 and the sapphire substrate 3 (a support substrate 3).

The composite substrate 1 of the present disclosure has a step bunch on the bonding surface 3a of the sapphire substrate 3 that is bonded to the piezoelectric substrate 2. The step bunch is a substantially equally spaced stepped structure having a facet plane of a specific crystal orientation. Because the bonding surface 3a of the sapphire substrate 3 has the step bunch, a part of the bulk waves is absorbed at the bonding surface 3a. As a result, the reflected bulk waves toward the element forming surface 2a (that is, a functional part of the element electrode or the like) are reduced. Therefore, the generation of noise can be effectively reduced.

Further, the stepped structure can also increase the strength of the bonding between the sapphire substrate 3 and the piezoelectric substrate 2. Therefore, it is possible to provide the composite substrate 1 in which the bonding strength between the piezoelectric substrate 2 and the sapphire substrate 3 is high and the reflection of bulk waves at the bonding surface 3a is reduced.

The half-width of an X-ray rocking curve of the third surface 3a may be, for example, 0.1° or less and may even be 0.05° or less. This means that crystal defects and residual stress are relatively small. This can more effectively reduce the reduction of the bonding strength between the piezoelectric substrate 2 and the sapphire substrate 3, and further reduce the reflection of bulk waves. The X-ray rocking curve can be measured using an X-ray diffractometer (XRD system).

The step bunch can be formed by heat-treating the sapphire substrate 3 including the third surface 3a having a predetermined off-angle to specific crystal planes such as a c-plane, a-plane, m-plane or r-plane, under appropriate conditions. For example, the step bunch whose upper surface is the c-plane is formed by heat-treating the sapphire substrate 3 including the third surface 3a having the predetermined off-angle from the c-plane.

Figure 2:
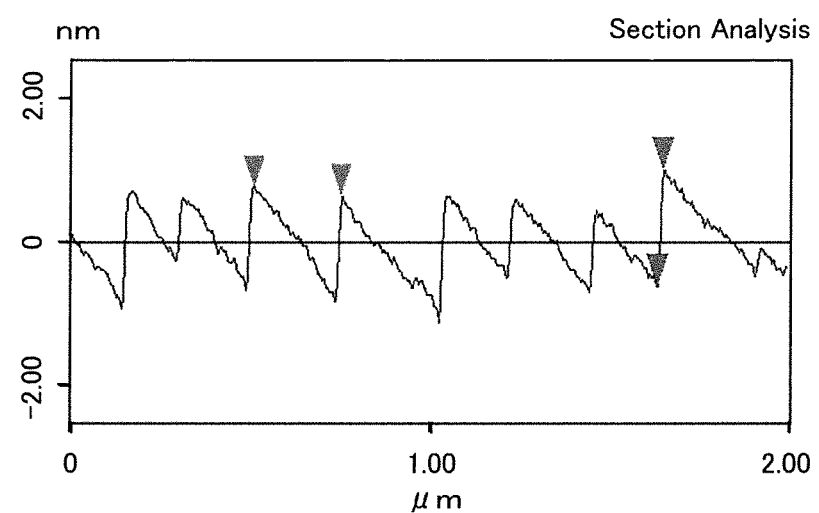
FIG. 2 is an image of an atomic force microscope (AFM) in place of a drawing, showing a main part of the composite substrate shown in FIG. 1.
Figure 2:
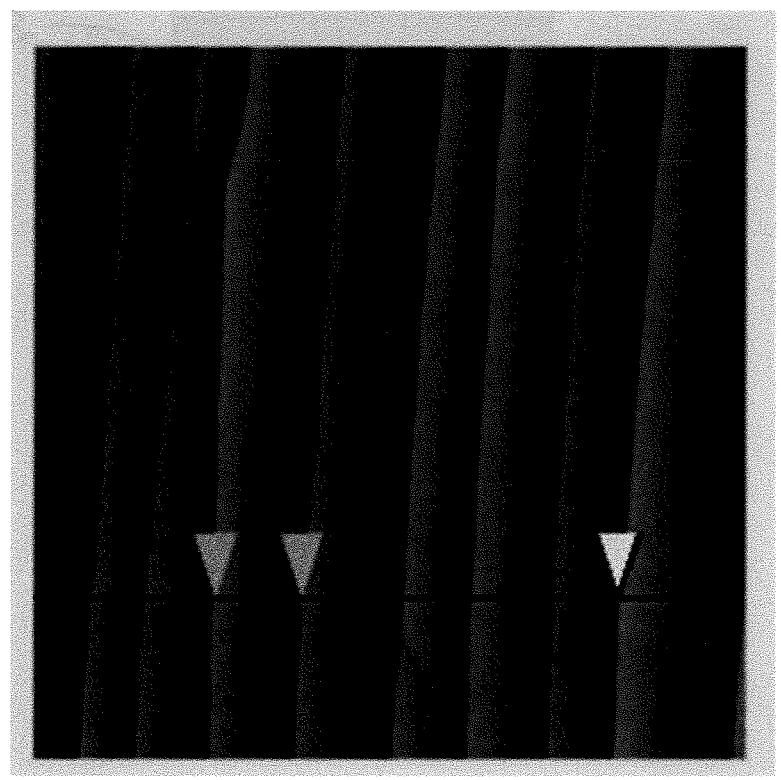

FIG. 2 shows an atomic force microscope (AFM) image of the sapphire substrate 2 having the step bunch. Along with the image (photo), an analysis graph, which is along a line indicated by a triangular figure in the image, is shown. In the sapphire substrate 2 shown in FIG. 2, the step bunch is formed with a step width of approximately 200 nm and a step height of approximately 2 nm. The step width is the mean value of the width (interval) of each step on a measurement line of the analysis graph, that is, a value obtained by dividing the length of the measurement line by the number of steps, and the step height is the mean value of the distance in the vertical axis direction between adjacent steps on the measurement line of the analysis graph.

On the third surface 3a, it is particularly desirable to have an arithmetic mean roughness Ra of 0.05 nm to 2.0 nm in a line roughness curve in the direction in which the step is crossed substantially vertically. The direction in which the step is crossed substantially vertically is the direction in which the lateral distance between the steps is the smallest, that is, the direction in which the third surface 3a is the most tilted from a specific crystal orientation plane (for example, the c-plane). A perpendicular in this case is not necessarily limited to a case where it is perpendicular by a geometric definition (a case where an intersecting angle is exactly 90°) but includes a case where it is off by ±5°. For the step bunch, it is possible to control a step form (width and height) by the control of the off-angle and heat treatment conditions. The off-angle from the c-plane, a-plane, m-plane, or r-plane is 2° or less, particularly preferably 1° or less. The width and height of the step is 50 nm to 2 μm and 0.2 nm to 10 nm, respectively.

The arithmetic mean roughness Ra and the width and height of the step can be measured, for example, using the atomic force microscope (AFM) with a measurement range of about 4 μm². The width and height of the step may be obtained from the mean values of the width (pitch) and height (step) of each step on a straight line that crosses multiple steps substantially perpendicularly within the measurement range.

The piezoelectric substrate 2 is composed of materials having piezoelectricity such as lithium tantalate (LT), lithium niobate (LN), zinc oxide, and quartz crystal. The support substrate 3 is the sapphire substrate 3. Sapphire is superior in mechanical strength, insulation, and heat dissipation, and therefore is suitable as a support substrate. The first surface 2a of the piezoelectric substrate 2 can have good device characteristics if the arithmetic mean roughness Ra is 1 nm or less. If the fourth surface 3b of the sapphire substrate 3 has the arithmetic mean roughness Ra of 1 μm or more, the reflection of bulk waves on the fourth surface 3b can be reduced, which is effective in improving the device characteristics.

<Method for Manufacturing Composite Substrate>

Hereinafter, the method for manufacturing the composite substrate of the present disclosure is explained. The method for manufacturing the composite substrate according to one embodiment of the present disclosure includes the steps of: preparing the piezoelectric substrate 2 and the sapphire substrate 3 including the third surface 3a having the predetermined off-angle to specific crystal planes such as the c-plane, a-plane, m-plane, or r-plane; heat treating the sapphire substrate 3 in an oxidizing atmosphere to form the step bunch on the third surface 3a; and bonding the piezoelectric substrate 2 and the third surface 3a of the sapphire substrate 3 directly. By the above steps, a composite substrate as shown in FIG. 1, for example, can be produced. Since members used in each step are similar to those shown in FIG. 1, figures of the manufacturing method are omitted.

Hereinafter, the details of the method for manufacturing the composite substrate according to one embodiment are explained. First, the piezoelectric substrate 2 having the first surface 2a and the second surface 2b opposing each other, and the sapphire substrate 3 having the third surface 3a and the fourth surface 3b opposing each other are prepared. The first surface 2a is the element forming surface, the second surface 2b and the third surface 3a are the bonding surfaces, and the fourth surface 3b is the back surface. The sapphire substrate 3 is prepared by cutting an ingot-shaped or ribbon-shaped sapphire single crystal grown by an appropriate growing method so as to have the predetermined off-angle to specific crystal planes such as the c-plane, a-plane, m-plane, or r-plane. The second surface 2b of the piezoelectric substrate 2 and the third surface 3a of the sapphire substrate 3 are planarized using a lapping device or the like. If the third surface 3a is processed so that the arithmetic mean roughness Ra is 0.1 μm or less, the step bunch of good quality can be obtained.

Next, at least the third surface 3a of the sapphire substrate 3 is heat-treated in an oxidizing atmosphere such as air atmosphere. For example, if it is an air atmosphere treatment, the heat treatment is carried out at 1000° C. to 1400° C. for 1 hour to 24 hours. This treatment forms the step bunch on the third surface 3a. By appropriately selecting the off-angle of the third surface 3a, processing temperature, and processing time, a step bunch form having a desired shape (width and height) can be obtained.

In a mechanical process such as a lapping process, a processing altered layer containing a lot of crystal defects and residual stress exists on a processing surface, whereas the third surface 3a including the step bunch has relatively few crystal defects and residual stress, thus increasing the bonding strength of the composite substrate 1 compared to a concavo-convex structure by the mechanical process such as the lapping process. Unlike the concavo-convex structure by anisotropic etching, the step bunch has high flexibility in selecting the substrate material and crystal orientation. Further, the step form (width and height) can be controlled by the control of the off-angle.

Next, at least one of the second surface 2b of the piezoelectric substrate 2 and the third surface 3a of the sapphire substrate 3 is activated by a method such as a plasma treatment. The piezoelectric substrate 2 and the sapphire substrate 3 are then bonded by the direct bonding without using adhesive materials. For example, the piezoelectric substrate 2 and the sapphire substrate 3 are heated and/or pressured in a vacuum, in air, or in a predetermined atmosphere to diffuse atoms at the bonding interface, resulting in diffusion bonding. By the previous activation process, the temperature at the time of bonding can be lowered, and therefore, the causes of damage and poor processing accuracy due to the difference in thermal expansion coefficient of the piezoelectric substrate 2 and the sapphire substrate 3 can be reduced.

In the direct bonding of the piezoelectric substrate 2 and the sapphire substrate 3, diffusion bonding by the diffusion of atoms between the piezoelectric substrate 2 and the sapphire substrate 3 is used. If the sapphire substrate 3 has the step bunch on the third surface 3a, the bonding strength is improved. After bonding the piezoelectric substrate 2 and the sapphire substrate 3, the thickness of the sapphire substrate 3 may be thinned by the lapping process or the like. In this case, the sapphire substrate 3 is removed from the fourth surface 3b side by the above process. The thickness of the piezoelectric substrate 2 may be thinned by the lapping process or the like. It is suitable to process the first surface 2a of the piezoelectric substrate 2 by CMP processing or the like so that the arithmetic mean roughness Ra is 1 nm or less.

The embodiments of the present disclosure are described above. However, the present disclosure is not limited to the embodiments described above, and various improvements and changes may be made without departing from the scope of the present disclosure.

DESCRIPTION OF THE REFERENCE NUMERALS 1 composite substrate
2 piezoelectric substrate
2a first surface (element forming surface)
2b second surface (bonding surface of piezoelectric substrate)
3 sapphire substrate
3a third surface (bonding surface of sapphire substrate)
3b fourth surface (back surface)

The invention claimed is:

1. The composite substrate comprising a piezoelectric substrate and a sapphire substrate which are directly bonded, wherein the sapphire substrate has a step bunch on a bonding surface with the piezoelectric substrate.

2. A composite substrate according to claim 1, wherein an arithmetic mean roughness Ra of a line roughness curve in the direction that crosses the step bunch substantially vertically on the bonding surface is 0.05 nm to 2.0 nm.

3. A composite substrate according to claim 1, wherein each step of the step bunch has a width of 50 nm to 2 μm and a height of 0.2 nm to 10 nm.

4. A composite substrate according to claim 1, wherein the bonding surface has an off-angle of 2° or less from a c-plane, a-plane, m-plane, or r-plane.

5. A composite substrate according to claim 1, wherein the half-width of an X-ray rocking curve of the bonding surface is 0.1° or less.

6. A piezoelectric device comprising the composite substrate according to claim 1.

7. A piezoelectric device according to claim 6, which is a surface acoustic wave device.

8. A method for manufacturing the composite substrate of claim 1, comprising the steps of:
preparing the piezoelectric substrate and the sapphire substrate including the bonding surface;

heat treating the sapphire substrate in an oxidizing atmosphere to form the step bunch on the bonding surface of the sapphire substrate; and bonding the piezoelectric substrate and the surface of the sapphire substrate directly.

9. A method for manufacturing a composite substrate comprising the steps of:

preparing a piezoelectric substrate and a sapphire substrate including a surface having a predetermined off-angle to a specific crystal plane;

heat treating the sapphire substrate in an oxidizing atmosphere to form a step bunch on the surface of the sapphire substrate; and bonding the piezoelectric substrate and the surface of the sapphire substrate directly.

10. The method for manufacturing a composite substrate according to claim 9, wherein the sapphire substrate whose off-angle from a c-plane, a-plane, m-plane, or r-plane is 2° or less is prepared in the preparing and heat-treated in the heat treating at 1000°° C. to 1400° C. for 1 hour to 24 hours in an air atmosphere treatment.

11. The method for manufacturing a composite substrate according to claim 9, wherein the bonding surface of the sapphire substrate includes a predetermined off-angle to a specific crystal plane, which is one of a c-plane, a-plane, m-plane, or r-plane, the predetermined off-angle is 2° or less, and the sapphire substrate is prepared in the preparing and heat-treated in the heat treating at 1000°° C. to 1400°° C. for 1 hour to 24 hours in an air atmosphere treatment.

* * * * *